Figure 1:
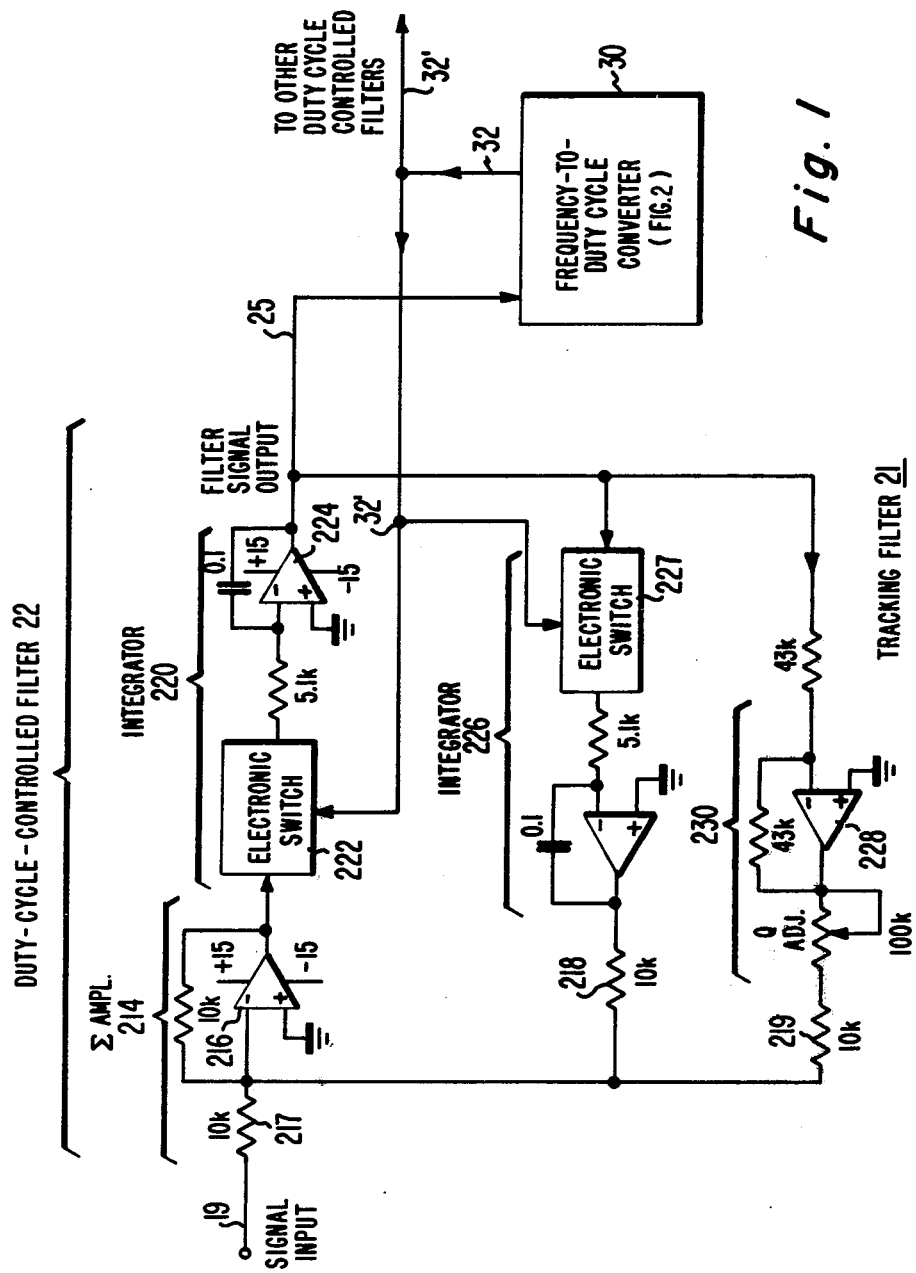

United States Patent [19]

Sutphin, Jr.

[11] 4,204,171
[45] May 20, 1980

[54] FILTER WHICH TRACKS CHANGING FREQUENCY OF INPUT SIGNAL

[75] Inventor: Eldon M. Sutphin, Jr., Merrimack, N.H.

[73] Assignee: RCA Corporation, New York, N.Y.

[21] Appl. No.: 910,889

[22] Filed: May 30, 1978

[51] Int. Cl.² .............................................. H03B 3/04
[52] U.S. Cl. .................................... 328/167; 328/140
[58] Field of Search ..................... 328/140, 167, 138

[56] References Cited

U.S. PATENT DOCUMENTS

| | | | |
|---|---|---|---|
| 3,539,827 | 11/1970 | Crowe | 328/138 X |
| 3,978,416 | 8/1976 | Sutphin | 328/167 |
| 4,021,794 | 5/1977 | Carlson | 328/138 X |
| 4,032,852 | 6/1977 | Hulls et al. | 328/167 |

Primary Examiner—John S. Heyman
Attorney, Agent, or Firm—Samuel Cohen; Carl V. Olson

[57] ABSTRACT

A tracking band-pass filter useful for locking onto, and passing, an input signal which changes rapidly in frequency. The filter has a frequency pass band controlled by a rectangular voltage waveform which is derived from the output signal passed by the filter. The filter output signal is translated from a sine wave to a pulse wave. The period between each two successive pulses is measured by counting the cycles of an oscillator during each respective period. The time-representing count is inverted to a frequency-representing count which controls the duty cycle of a rectangular wave used to make the filter track the changing frequency of the input signal.

6 Claims, 2 Drawing Figures

FILTER WHICH TRACKS CHANGING FREQUENCY OF INPUT SIGNAL

Tracking filters are known which have a frequency pass band that tracks or follows the changing frequency of a signal applied to the input of the filter. Such tracking filters include an active filter and feedback means to control the frequency pass band of the filter in accordance with the frequency of the output signal from the filter. A known tracking filter is described in U.S. Pat. No. 3,978,416 issued on Apr. 30, 1975 to Eldon M. Sutphin, Jr. and assigned to the assignee of the present application.

According to an example of the present invention, an improved tracking band-pass filter capable of tracking an input signal having a rapidly changing frequency includes an active filter having a frequency control terminal. The output sine wave signal from the filter is translated to a pulse wave. The time period between successive pulses is converted to a frequency-representing count which controls the duty cycle of a rectangular wave applied to the frequency control terminal of the filter to make it track the changing frequency of the input signal.

Figure 2:
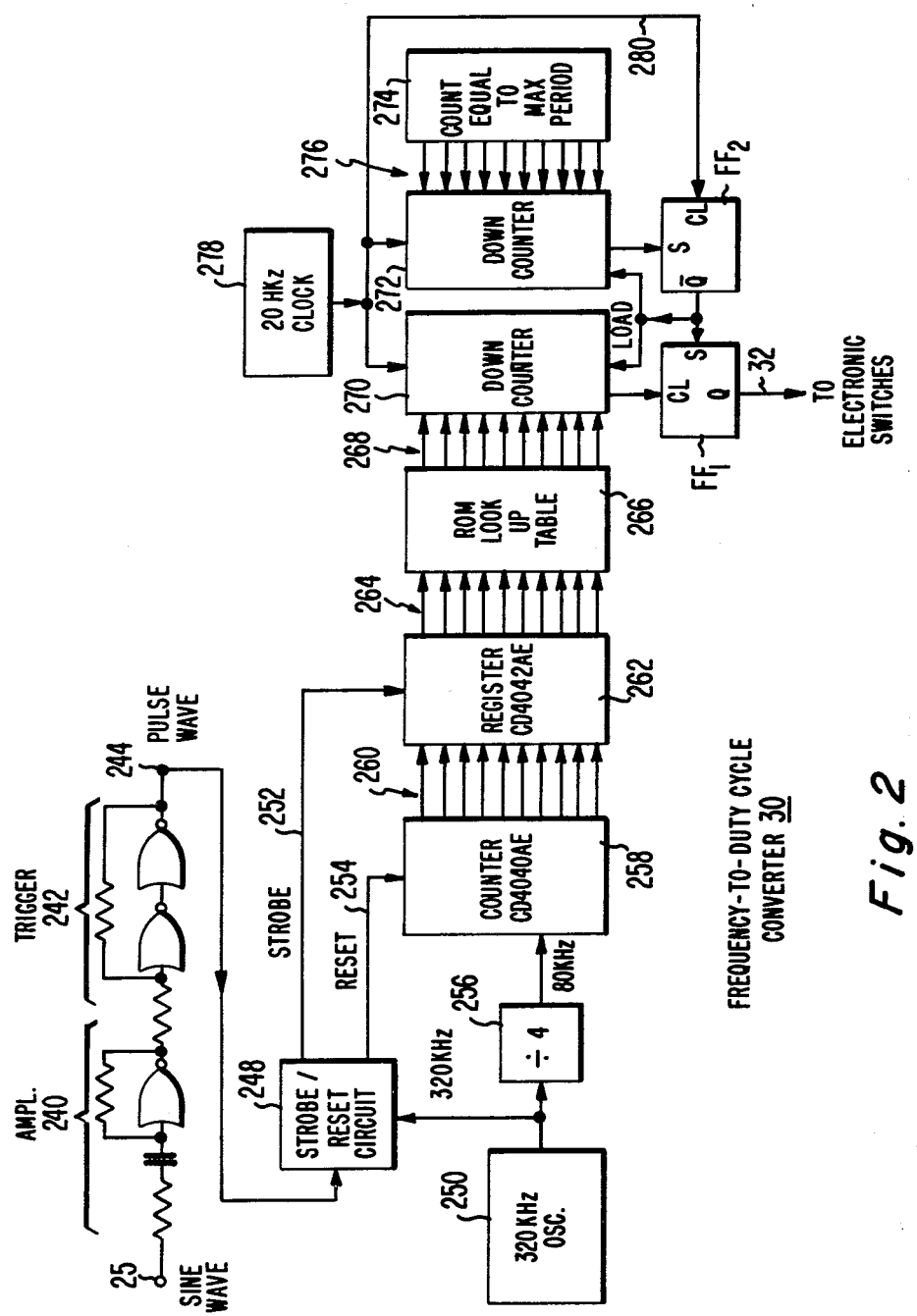

In the drawing:

FIG. 1 is a system diagram of a tracking filter constructed according to the teachings of the invention; and FIG. 2 is a block diagram of a frequency-to-voltage converter included in the system of FIG. 1.

Reference is now made in greater detail to the tracking filter of FIG. 1. The tracking filter includes a duty-cycle-controlled filter 22 having a signal input terminal 19 and a signal output terminal 25. The input terminal is connected to a summation amplifier 214 consisting of an operational amplifier 216 connected as an inverting gain amplifier having summation input resistors 217, 218 and 219. Inverting gain amplifiers are described at page 172 of "Operational Amplifiers-Design and Applications" edited by Tobey, Graeme and Huelsman and published by McGraw-Hill in 1971. The operational amplifier 216, and other operational amplifiers in FIG. 1 may be constituted by one-fourth of a Texas Instruments TL084 operational amplifier unit.

The output of summation amplifier 214 is connected to an input of an integrator 220 including an electronic switch 222, and an operational amplifier 224 connected as an integrator. The switch 222 may be one-third of a Type CD4053 unit manufactured by RCA Corporation. The output 25 of the integrator is connected in a feedback path consisting of an integrator 226 like integrator 220, and in a parallel feedback path consisting of an operational amplifier 228 connected as an inverting gain amplifier 230.

The duty-cycle-controlled filter 22 in FIG. 1 is similar in construction and purpose to the voltage-controlled filter 200 in U.S. Pat. No. 3,978,719, the difference being that filter 22 includes electronic switches 222 and 227 in integrators 220 and 226, in place of the multipliers used in the prior art filter 200. The electronic switches in filter 22 control the amount of current passed to the operational amplifiers in proportion to the duty-cycle of the rectangular wave control signal applied to the control inputs of switches, whereas the multipliers in the prior art filter 200 control the amount of current passes to the operational amplifiers in proportion to the control voltage applied to the Y inputs of the multipliers. The rectangular wave control signal which determines the frequency band passed by filter 22 is supplied by a frequency-to-duty-cycle converter 30 (to be described in connection with FIG. 2). The converter 30 produces a rectangular wave having a duty-cycle proportional to the frequency of the sine wave signal at the output of the filter, and the frequency-to-voltage converter which produces a control voltage proportional to the frequency of the sine wave signal at the output of the filter. The frequency-to-duty-cycle converter 30 is entirely digital in operation, and the converter 30 is capable of reacting with extreme speed and accuracy to changes in the frequency of the signal passed by the filter 22 to cause the pass band of the filter to track the changing frequency of the signal.

The frequency-to-duty-cycle converter 30 in FIG. 1 is shown in detail in FIG. 2. The input 25 of the converter is connected through a class A amplifier 240 and a trigger circuit with hysteresis, or a limiting amplifier, 242 which produces a pulse wave at 244. The pulse wave is applied to a strobe/reset circuit 248 which also receives a 320 kHz square wave from an oscillator 250. The circuit 248 produces a strobe output pulse at 252, and shortly thereafter a reset output pulse at 254. The strobe and reset pulses occur once per cycle of the input pulse wave, which may have a repetition rate of a few hundred pulses per second. The strobe and reset pulses which have the duration of a half cycle of the square wave from the 320 kHz oscillator. The strobe/reset circuit may have a detailed circuit diagram as shown in FIG. 10 of U.S. Pat. No. 3,978,719.

The frequency-to-duty-cycle converter of FIG. 2 includes a divide-by-four circuit 256 which divides the 320 kHz square wave from oscillator 250 to an 80 kHz pulse wave which is applied to the input of a counter 258. The divider 256 may be constituted by an RCA CD4027AE integrated circuit unit wired in a conventional manner.

The counter 258 counts the 80 kHz input pulses until it is reset by a reset pulse over line 254 from circuit 248. The counter, which may be an RCA CD4040AE integrated circuit unit, has ten output lines 260 over which the count is transferred to a storage register 262 when the register is gated by a strobe pulse over line 252 from the circuit 248. The register 262 may consist of three RCA CD4042AE integrated circuit units. The register 262 has ten output lines 264 connected to the address input of a read-only-memory look-up table 266 which has ten outputs connected to ten inputs of a down counter 270. The 10 bits on the ten lines 264 from the register 262 represent a number between 0 and 1023 proportional to the period of the sine wave passed at 25 by the duty-cycle-controlled filter 22 in FIGS. 1 and 2. The sine wave may have a frequency between 5 and 200 Hz depending on engine speed. The 10 bits are applied as an address to the read-only-memory (ROM) look-up table 266 to access one of the 1024 memory locations in memory and read out the contents thereof over lines 268 to the down counter 270. The word read out from a memory storage location is a number between 0 and 1023 representing the frequency of a sine wave having the period represented by the address of the storage location. Therefore, the output, representing frequency, of ROM 266 varies inversely with the input thereto representing period or wavelength. The ROM 266 may be three Type 6353-1 integrated circuit units made by Monolithic Memories, Inc.

The down counter 270 receives a count between 25 and 1023 representing a frequency between 5 and 200 Hz of the sine wave from filter 22 in FIGS. 1 and 2. At the same time, under control of a "load" signal, a second similar down counter 272 receives a maximum count of 1023 from a source 274 of ten "1" bits on ten lines 276. Down counters 270 and 272 may each be comprised by three Type 74191 integrated circuits made by Texas Instruments. Both down counters receive pulses from a 20 MHz clock 278, and with each received pulse count down one count from the loaded values toward zero. When the count in down counter 270 reaches zero, it provides an output to the clock input CL of flip-flop $FF_1$, and when the count in down counter 272 reaches zero at a later time, it provides an output to the set input S of the flip-flop $FF_2$. Flip-flops $FF_1$ and $FF_2$ may be a Type 7474 integrated circuits made by Texas Instruments.

When flip-flop $FF_2$ receives a clock pulse over line 280 from clock 278, simultaneously with a set pulse from down counter 272, it produces a $\overline{Q}$ output which loads counts into down counters 270 and 272, and sets flip-flop $FF_1$ via its set input S so that the output Q of $FF_1$ is high. This closes electronic switches 222 and 227 in FIG. 2. Subsequently when down counter 270 counts down to zero and xupplies an output to the clock input CL of flip-flop $FF_1$, $FF_1$ is reset, opening electronic switches 222 and and 227 in FIG. 2, and it remains reset until set by flip-flop $FF_2$.

To summarize the operation, a cycle begins when both down counters are loaded and flip-flop $FF_1$ starts providing a positive or high output level at 32. When down counter 270, which counts down from some value between 0 and 1023, reaches zero, the positive output level at output 32 of flip-flop $FF_2$ goes to zero. When down counter 272 counts down from 1023 to zero, which takes 51.2 microseconds, both down counters are reloaded and output 32 of flip-flop $FF_1$ is set high, thus starting a next cycle of operation. During each cycle, the output at 32 is positive for the proportion of 51.2 microseconds that the count loaded into down counter 270 bears to 1024. The duty-cycle of the positive level at 32 varies directly with the frequency of the sine wave passed at 25 by duty-cycle-controlled filter 22.

The output at 32 of the frequency-to-duty-cycle converter of FIG. 2 is connected to the frequency control input terminal 32' of the duty-cycle controlled filter 22 in FIG. 1 to make the filter track changes in the frequency component passed by the filter as the frequency changes with changes in engine speed.

The herein-described tracking filter is also described as a useful part of an engine diagnostic system in a patent application Serial No. concurrently filed for L. R. Hulls, S. C. Hadden and L. R. Armstrong on "Engine Fault Diagnosis."

What is claimed is:

1. A tracking filter, comprising
a duty-cycle-controlled variable-frequency band-pass filter having a signal input terminal receptive to an electrical signal having many frequency components and having a signal output terminal for a selected frequency component which varies in frequency in direct proportion with engine speed, and having a frequency control input terminal,
a frequency-to-duty-cycle converter coupled to said output terminal and operative repeatedly to translate each period of said selected frequency component to a rectangular wave having a duty cycle proportional to the frequency of said selected frequency component, and
means to apply said rectangular wave to the control input terminal of said duty-cycle-controlled filter, whereby the filter tracks changes in the frequency of the selected frequency component passed by the filter.

2. A tracking filter according to claim 1 wherein said duty-cycle-controlled filter includes a first duty-cycle-controlled integrator coupled from said signal input terminal to said signal output terminal, and a second duty-cycle-controlled integrator coupled in a parallel feedback path from said signal output terminal to said signal input terminal.

3. A tracking filter according to claim 2 wherein said converter includes a trigger circuit connected to translate the selected frequency component passed through said filter to a pulse wave.

4. A tracking filter according to claim 3 wherein said converter includes a constant-frequency oscillator, a counter coupled to count the cycles from the oscillator during each interval between successive pulses from the trigger circuit, and means to translate each time-representing count from the counter to a rectangular wave having a frequency-representing duty-cycle.

5. A tracking filter according to claim 4 wherein said means to translate each time-representing count from the counter to a rectangular wave having a frequency-representing duty cycle includes
a look-up table connected to translate said time-representing count to a reciprocally-related frequency-representing count, and
means to generate a rectangular wave having a duty cycle equal to the ratio between said frequency-representing count and a maximum-frequency-representing reference count.

6. A tracking filter according to claim 5 wherein said means to generate a rectangular wave includes first and second down counters, and logic means responsive to the operation of said counters.

* * * * *